US011208593B2

(12) United States Patent
Martiny et al.

(10) Patent No.: US 11,208,593 B2
(45) Date of Patent: Dec. 28, 2021

(54) LUMINESCENT MATERIALS (71) Applicants: LUMILEDS HOLDING B.V., Schiphol (NL); LUDWIG-MAXIMILIANS-UNIVERSITAET MUENCHEN, Munich (DE)

(72) Inventors: Christoph Martiny, Aachen (DE); Peter Josef Schmidt, Aachen (DE); Christian Maak, Aachen (DE); Wolfgang Schnick, Aachen (DE)

(73) Assignee: LUMILEDS HOLDING B.V.

( * ) Notice: Subject to any disclaimer, the term of this patent is extended or adjusted under 35 U.S.C. 154(b) by 252 days.

(21) Appl. No.: 16/373,043

(22) Filed: Apr. 2, 2019

(65) Prior Publication Data
US 2019/0309224 A1 Oct. 10, 2019

(30) Foreign Application Priority Data

Apr. 6, 2018 (EP) .................................. 18166093

(51) Int. Cl.
C09K 11/77 (2006.01)
H01L 33/50 (2010.01)
C09K 11/59 (2006.01)

(52) U.S. Cl.
CPC .......... *C09K 11/7783* (2013.01); *C09K 11/59* (2013.01); *C09K 11/77747* (2021.01); *C09K 11/77748* (2021.01); *H01L 33/502* (2013.01)

(58) Field of Classification Search
CPC .......... C09K 11/7783; C09K 11/77747; C09K 11/77748; H01L 33/502
See application file for complete search history.

(56) References Cited

U.S. PATENT DOCUMENTS

2013/0147344 A1  6/2013 Won et al.
2013/0234588 A1* 9/2013 Seto .................. C09K 11/7706
                                                    313/503

FOREIGN PATENT DOCUMENTS

EP    2141216 A1   1/2010
EP    3075814 A1   10/2016

OTHER PUBLICATIONS

European Search Report corresponding to EP18166093, dated Oct. 11, 2018, 1 page.
The extended European search report corresponding to EP18166093.7, dated Oct. 19, 2018, 8 pages.
From the EPO as the ISA, "Notification of Transmittal of the International Search Report and the Written Opinion of the International Searching Authority, or the Declaration", PCT/EP2019/057840, dated Jul. 23, 2019, 13 pages.
Seto et al., "A New Yellow Phosphor La3Si6N11:Ce3+ for White LEDs", ECS Transactions, 25 (9) 247-252 (2009), 10.1149/1.3211183 © The Electrochemical Society, 6 pages.

* cited by examiner

*Primary Examiner* — C Melissa Koslow (57) ABSTRACT

Embodiments of the invention are directed to a luminescent ceramic including a first phase and a second phase. The first phase is $R_{3-x-y-z+w2}A_{1.5x+y-w2}M_zSi_{6-w1-w2}Al_{w1-w2}N_{11-y-w1}O_{y+w1}$. R is selected from the group comprising trivalent La, Gd, Tb, Y, Lu; A is selected from the group comprising bivalent Ca, Mg, Sr, Ba, and Eu; and M is selected from the group comprising trivalent Ce, Pr and Sm. The second phase may be or comprise, for example, $RE_3ASi_5N_9O_2$ and $RESi_3N_5$, wherein RE is at least one rare-earth element selected from the group consisting of La, Gd, Lu, Y, Ce and Sc and wherein A is at least one metal element selected from the group consisting of Ba, Sr, Ca, Mg, Zn and Eu.

20 Claims, 6 Drawing Sheets

LUMINESCENT MATERIALS

CROSS-REFERENCE TO RELATED APPLICATIONS

This application claims benefit of priority to European Patent Application 18166093.7 titled "Luminescent Materials" and filed Apr. 6, 2018, which is incorporated herein by reference in its entirety.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

A light emitting device such as an LED is often combined with a wavelength converting material such as a phosphor. US 2013/0234588 describes "a new phosphor [with a] red light component and . . . a large full width at half maximum." (Abstract.) Paragraph 20 of US 2013/0234588 teaches "a phosphor including a crystal phase represented by the formula [I] . . . $R_{3-x-y-z+w2}M_zA_{1.5x+y-w2}Si_{6-w1-w2}Al_{w1-w2}O_{y+w1}N_{11-y-w1}$ [I]. (In the formula [I], R represents at least one kind of a rare-earth element selected from the group consisting of La, Gd, Lu, Y and Sc, M represents at least one kind of a metal element selected from the group consisting of Ce, Eu, Mn, Yb, Pr and Tb, A represents at least one kind of a bivalent metal element selected from the group consisting of Ba, Sr, Ca, Mg and Zn, and x, y, z, w1 and w2 are the numeric values in the following ranges: $(1/7) \leq (3-x-y-z+w2)/6 < (1/2)$, $0 < (1.5x+y-w2)/6 < (9/2)$, $0 < x < 3$, $0 \leq y \leq 2$, $0 < z < 1$, $0 \leq w1 \leq 5$, $0 \leq w2 \leq 5$, and $0 \leq w1+w2 \leq 5$)."

DETAILED DESCRIPTION

In the general formula [I] of the material described in US 2013/0234588, A represents a bivalent metal like Ca. There are two possibilities for introducing the bivalent ion A into the tetragonal crystal $RE_3Si_6N_{11}$ lattice according formula [I], while preserving charge neutrality. In the first, one bivalent Ca-ion substitutes for one trivalent RE-ion on a RE-site while one trivalent nitrogen ion is replaced by one bivalent oxygen ion. In the second, the incorporation of the bivalent ion A may occur in such a way that 1.5 bivalent A atoms replace one trivalent R atom. This implies that part of the bivalent atom A is located on additional lattice sites that are not occupied in the $RE_3Si_6N_{11}$ lattice. The location of these sites in the structure is not clarified in US 2013/0234588.

The inventors have investigated the incorporation of the bivalent atom A into the $RE_3Si_6N_{11}$ lattice using single-crystal X-ray data. Structure solution and refinement were conducted in the tetragonal space group P4bm (no. 100) with lattice parameters a=10.1142(6) Å, c=4.8988(3) Å, and formula units Z=2. As bivalent $Ca^{2+}$ ions substitute trivalent $La^{3+}$ ions in the system "$(La,Ca)_3Si_6N_{11}$", a previously unknown charge balance mechanism was necessary to ensure charge neutrality. According to single-crystal X-ray data, charge balance is provided by incorporation of $Ca^{2+}$ on the La1 and La2 site of the $La_3Si_6N_{11}$ structure type and additionally on a third cation site. Therefore, "$(La,Ca)_3Si_6N_{11}$" and $La_3Si_6N_{11}$ are homeotypic due to a differing number of cation sites. The incorporation mechanism of the bivalent A atoms into the $RE_3Si_6N_{11}$ lattice is confirmed to be described by the formula $RE_{3-x}A_{1.5x}Si_6N_{11}$. The atomic coordinates, isotropic displacement and site occupancy factors for the different atomic sites in $RE_{3-x}A_{1.5x}Si_6N_{11}$ are listed in Table 1 below for the exemplary case of RE=La, A=Ca and x=0.77, i.e. $La_{2.23}Ca_{1.155}Si_6N_{11}$.

TABLE 1

Atomic coordinates x, y, and z, isotropic displacement parameters $U_{eq}$ [$Å^2$], and site occupancy factors sof. Standard deviations are in parentheses.

| Atom | | x | y | z | $U_{eq}$ | s.o.f |
|---|---|---|---|---|---|---|
| La1A | 4c | 0.17982(2) | x + ½ | 0.02578(11) | 0.01043(12) | 0.583(3) |
| Ca1A | 4c | 0.17982(2) | x + ½ | 0.02578(11) | 0.01043(12) | 0.275(5) |

TABLE 1-continued

Atomic coordinates x, y, and z, isotropic displacement parameters $U_{eq}$ [Å$^2$], and site occupancy factors sof. Standard deviations are in parentheses.

| Atom | | x | y | Z | $U_{eq}$ | s.o.f |
|---|---|---|---|---|---|---|
| La1B | 4c | 0.1746(3) | x + ½ | 0.1994(11) | 0.01043(12) | 0.037(2) |
| Ca1B | 4c | 0.1746(3) | x + ½ | 0.1994(11) | 0.01043(12) | 0.105(5) |
| La2 | 2a | 0 | 0 | 0.00000(8) | 0.00487(10) | 0.974(4) |
| Ca2 | 2a | 0 | 0 | 0.00000(8) | 0.00487(10) | 0.026(4) |
| Ca3 | 4c | 0.0709(3) | x + ½ | 0.5669(9) | 0.00635(9) | 0.196(2) |
| Si1 | 8d | 0.07979(8) | 0.20816(8) | 0.5363(2) | 0.0050(2) | 1 |
| Si2 | 4c | 0.61879(8) | x − ½ | 0.0454(3) | 0.0044(2) | 1 |
| N1 | 8d | 0.0751(3) | 0.2318(3) | 0.1872(6) | 0.0064(5) | 1 |
| N2 | 8d | 0.1805(3) | 0.0800(3) | 0.6430(6) | 0.0073(5) | 1 |
| N3 | 4c | 0.6505(3) | x − ½ | 0.6957(8) | 0.0042(6) | 1 |
| N4 | 2b | ½ | 0 | 0.0719(16) | 0.0179(14) | 1 |

The atoms La1A/Ca1A, La1B/Ca1B, and La2/Ca2 occupy the same site, respectively.

Figure 1A:
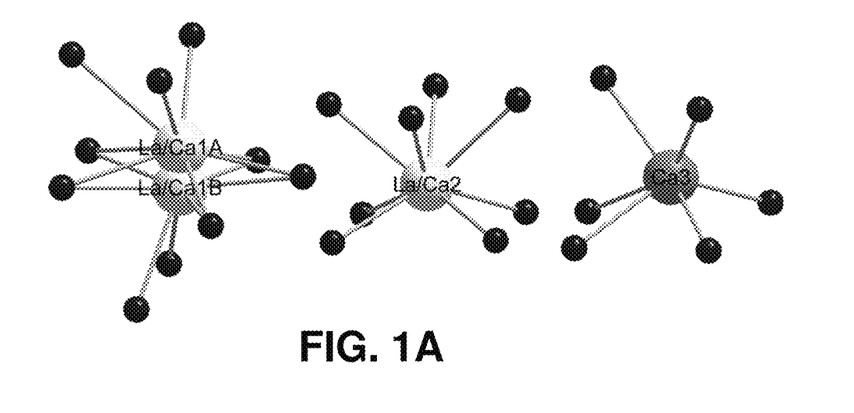
FIG. 1A illustrates three cation sites in $La_{3-x}Ca_{1.5x}Si_6N_{11}$.
Figure 1B:
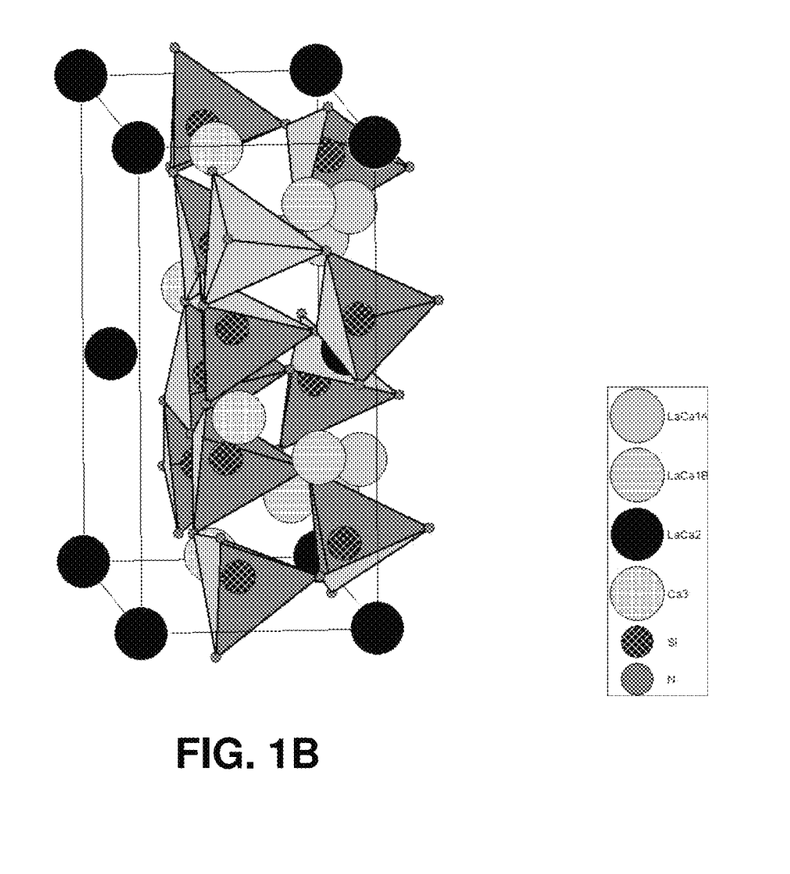
FIG. 1B illustrates the elementary cell of $La_{3-x}Ca_{1.5x}Si_6N_{11}$.

The site La2,Ca2 in $La_{3-x}Ca_{1.5x}Si_6N_{11}$:$Eu^{2+}$ is surrounded by eight N atoms forming a slightly distorted quadratic antiprism, comparable to $La_3Si_6N_{11}$. The second site La,Ca1A/La,Ca1B is coordinated by eight N atoms in the case of (La,Ca1A) and seven N atoms in the case of (La,Ca1B). This site is split in $La_{3-x}Ca_{1.5x}Si_6N_{11}$ as $Ca^{2+}$ ions statistically occupy the additional, under-occupied third cation site Ca3. Site La,Ca1A in $La_{3-x}Ca_{1.5x}Si_6N_{11}$ corresponds to site La1 in $La_3Si_6N_{11}$. However, the splitting of this site is necessary for $La_{3-x}Ca_{1.5x}Si_6N_{11}$ in order to avoid short interatomic La,Ca1A-Ca3 distances of only 2.7347(1) Å. Ca3 site in $La_{3-x}Ca_{1.5x}Si_6N_{11}$ is coordinated by six N atoms. FIG. 1A illustrates the surroundings of the three cation sites in $La_{3-x}Ca_{1.5x}Si_6N_{11}$. In FIG. 1A, the center, large atoms in the three examples are La or Ca, as indicated in each example, and the smaller atoms surrounding the center atoms are N. FIG. 1B illustrates the elementary cell of $La_{3-x}Ca_{1.5x}Si_6N_{11}$.

The single-crystal X-ray diffraction data enabled the clarification of the charge balance mechanism in $La_{3-x}Ca_{1.5x}Si_6N_{11}$. Consequently, charge neutrality is achieved by incorporation of $La^{3+}$ and $Ca^{2+}$ on three cation sites, whereas only two cation sites are present in $La_3Si_6N_{11}$. Thus, if 2 trivalent La-atoms are substituted by 3 bivalent Ca atoms, 2 Ca atoms are positioned on the La1A/Ca1A, La1B/Ca1B and La2/Ca2-sites while one Ca atom is located on a Ca3-site.

Embodiments of the invention include a luminescent material having a host material according to the formula $RE_{3-x-y-z+w2}A_{1.5x+y-w2}M_zSi_{6-w1-w2}Al_{w1+w2}N_{11-w1}O_{y+w1}$, where RE is selected from the group of trivalent La, Gd, Tb, Y, Lu; A is selected from the group of bivalent Ca, Mg, Sr, Ba, Zn and Eu; and M is selected from the group of trivalent Ce, Pr and Sm. In the above formula, in some embodiments the following constraints must be obeyed.

| | |
|---|---|
| $0 \le x \le 2$ | x is the number of trivalent RE atoms substituted by 1.5x bivalent atoms. 1x Ca are inserted on La1A/Ca1A or La1B/Ca1B and La2/Ca2 sites while 0.5x Ca are inserted on Ca3 sites. There are 2 Ca3 sites per formula unit but their maximum occupancy factor is 0.5 because otherwise 2 Ca atoms would come as close as 0.7 Angstrom from each other which is impossible. Thus the maximum number of Ca atoms on Ca3 position per formula unit is 1, which corresponds to $x_{max} = 2$. |
| $0 \le y \le 3$ | y is the number of trivalent RE ions substituted by y bivalent atoms on La1/2-sites with parallel substitution of y oxygen atoms on N-sites. It cannot exceed the maximum number of RE atoms which is 3. |
| $0 \le z \le 3$ | z is the number of trivalent metal ions substituting trivalent RE. It cannot exceed the maximum number of RE atoms which is 3. |
| $0 \le w1 \le 6$ | w1 is the number of oxygen-compensated Al atoms on Si-sites. Thus, its maximum number is limited by the number of Si-sites available. |
| $0 \le x + y + z − w2 \le 3$ | |
| $0 \le w1 + w2 \le 6$ | w1 + w2 is the total number of Al atoms on Si-sites. Thus w1 + w2 is limited by the number of Si-sites |
| $0 \le w2 \le x + y \le 3$ | x + y is the number of bivalent ions on La1/2-sites from which a portion w2 can be replaced by RE3+ if w2 Al are substituted on Si-sites. As the number of La1/2-sites is 3, w2 cannot exceed a value of 3 |

The host material $RE_{3-x-y-z+w2}A_{1.5x+y-w2}M_zSi_{6-w1-w2}Al_{w1-w2}N_{11-y-w1}O_{y+w1}$ may be doped with $Ce^{3+}$, $Eu^{2+}$, both $Ce^{3+}$ and $Eu^{2+}$, and any other suitable dopant. As indicated above, trivalent $Ce^{3+}$ substitutes for trivalent RE and the divalent $Eu^{2+}$ substitutes for divalent A. The material may emit light having a peak wavelength in the range orange-red when doped with $Eu^+$. The material may emit light having a peak wavelength in the range green-yellow when doped with $Ce^{3+}$. When doped with both $Ce^{3+}$ and $Eu^{2+}$, the peak wavelength depends on the relative concentration of Ce and Eu, though only tiny amounts of $Eu^{2+}$ may shift the color to red-orange. In some embodiments, when the sole dopant is $Eu^{2+}$, other species of A may be present but no species of M is present. In some embodiments, when the sole dopant is $Ce^{3+}$, no Eu is present but other species of A may be present, and other species of M besides Ce may be present.

The material may be excited by light having a peak wavelength in the range UV-blue.

RE is a rare earth metal from the group of La, Gd, Tb, Y, Lu. It is known from non-patent literature M. Woike, W. Jeitschko, Inorg. Chem. 34 (1995) 5105-5108 that the cell volume of tetragonal $Ln_3Si_6N_{11}$ phases decreases from Ln=La to Ce, Pr, Nd and Sm in correlation with the reduction of atomic radii of the lanthanide elements. Partial replacement of RE=La by smaller cations (such as, for example, Y, Gd, and Lu) in $RE_{3-x-y-z+w2}A_{1.5x+y-w2}M_zSi_{6-w1-w2}Al_{w1+w2}N_{11-w1}O_{y+w1}$ also leads to a cell volume reduction and to a spectral red shift of absorption and emission of the M dopant ions due to a shortening of the M-(O,N) contact lengths and a decrease of the energetic position of the $4f^{n-1} 5d^1$ levels of the M atoms relative to the $4f^n 5d^0$ ground state. For example, in some embodiments, the $Ce^{3+}$ emission maximum may shift from 530 nm to 580 nm (red shift=50 nm), and the $Eu^{2+}$ emission maximum may shift from 600 to 650 nm (red shift=50 nm). In one example, replacement of ~40% of $La^{3+}$ (effective ionic radius for coordination number 8=130 pm) by smaller $Y^{3+}$ (effective ionic radius for coordination number 8=116 pm) leads to a cell volume reduction of ~0.6% and a spectroscopic red shift of the emission peak by ~13 nm. In some embodiments, Y and/or Lu substitutes for no more than 50% La. In particular, in some embodiments, $RE=La_a(Y_b Lu_{1-b})_{1-a}$, where a≥0.5, 0≤b≤1; in some embodiments $R=La_a Y_{1-a}$, where a≥0.5; in some embodiments, $RE=La_a Lu_{1-a}$, where a≥0.5. A is a divalent metal that partially or completely replaces trivalent RE atoms on their lattice sites. While Ca(II) is about the same size as La(III), atoms like Sr(II) are larger and can help stabilize the introduction of smaller trivalent RE atoms like Y(III) or Lu(III). The size difference of $Sr^{2+}$ and $Ca^{2+}$ is identical with that of $La^{3+}$ and $Y^{3+}$ (effective ionic radius for coordination number 8=140 pm for $Sr^{2+}$ and 126 pm for $Ca^{2+}$). Based on the different ionic sizes, in some embodiments, 100% La can be replaced by 50% Sr and 50% Y. Due to the different sizes the smaller ion (for example, $Y^{3+}$) should preferably occupy the 2A position. In particular, in some embodiments, $RE=Y_{0.5}Sr_{0.5}$. Al can be substituted for Si in the same way as known for e.g. the SiAlON material $Nd_3Si_5AlON_{10}$ described by R. Lauterbach, W. Schnick, Z. anorg. allg. Chem. 626 (2000) 56-61, that is isotypic with the corresponding $Ln_3Si_6N_{11}$ nitridosilicates. Part of Si is replaced by Al while the introduced charge can be compensated by either replacing a bridging N[2] by O or by replacing a trivalent RE atom by a bivalent A atom, such that SiAlON is formed. SiAlON formation leads to an expansion of the lattice due to the introduction of longer Al—O contacts for shorter Si—N contacts and mainly to a broadening of the phosphor emission due to inhomogeneous broadening introduced by multiple chemical surroundings of the activator sites. Spectral broadening can be especially useful to improve the color rendition of wavelength converted light emitting devices, including wavelength converting materials according to some embodiments of the invention. No more than 5% of Si is replaced by Al in some embodiments (w1<0.3) and no more than 2% of Si is replaced by Al in some embodiments (w1<0.12). In some embodiments, the emission band may broaden by about 2 nm for every % Al substituted for Si. A small amount of Al may be beneficial for compensating excessive oxygen and/or to promote sintering of dense ceramic samples. In some embodiments, the wavelength converting materials described above are formed into a luminescent ceramic. As used herein, "luminescent ceramic" refers to a wavelength converting material formed into a structure that is monolithic slab or tile that is self supporting (i.e., a self supporting structure can be formed and handled separately from the light source). The wavelength converting material may be sintered, such that other than the wavelength converting material itself, no binder material is necessary to form the tile. The luminescent ceramic may be a dense, polycrystalline structure. In some embodiments, the luminescent ceramic is so dense that porosity in the luminescent ceramic is limited to no more than 1 volume-%.

Luminescent ceramics may be desirable for several reasons.

First, in high intensity illumination applications, the pump LEDs are driven at high currents and generate a great deal of heat, which heats up a wavelength converting structure in direct contact with the LED. The efficiency of wavelength converting materials is typically reduced by excess heat; therefore, it is crucial for the performance of the wavelength converting material to eliminate as much heat as possible. The thermal conductivity of a luminescent ceramic will generally exceed the thermal conductivity of alternative wavelength converting structures, enabling a lower operating temperature of the luminescent ceramic and thereby avoid the conversion efficiency being affected by thermal quenching losses.

Second, for a given amount of light conversion, a luminescent ceramic may require less doping than other wavelength converting structures. Reduced doping concentration may reduce or eliminate concentration quenching concentration quenching can reduce the efficiency of the wavelength converting material.

Third, a luminescent ceramic may be more transparent than other wavelength converting structures, in particular a suspension of phosphor powder particles in silicone. The higher transparency may increase efficiency by reducing back-scattering of the LED light and by increasing conversion efficiency.

Fourth, a luminescent ceramic may be limited to the same lateral dimensions as the pump LED, which may improve efficiency by limiting the source size. Other wavelength converting structures, in particular suspensions of phosphor powders in silicone disposed on the pump LED, are typically larger than the LED and thereby increase the source size.

In some embodiments, a luminescent ceramic includes $RE_{3-x-y-z+w2}A_{1.5x+y-w2}M_zSi_{6-w1-w2}Al_{w1+w2}N_{11-w1}O_{y+w1}$ or any of the other materials described above as a first phase. The luminescent ceramic also includes a second phase. The first phase, though it may be any of the materials described above, is often $RE_3Si_6N_{11}$ (RE=La, Gd, Lu, Y, and/or Sc) or $La_3Si_6N_{11}$, and is therefore referred to as such in the discussion below for economy of language, not to limit embodiments of the invention to these materials. The second phase may be any suitable material, and is often $RESi_3N_5$ and/or $RE_3ASi_5N_9O_2$ (RE=at least one of La, Gd, Lu, Y, Ce and Sc; A=at least one of Ba, Sr, Ca, Mg, Zn and Eu).

In some embodiments, when formed into a luminescent ceramic, the first phase material $RE_{3-x-y-z+w2}A_{1.5x+y-w2}M_zSi_{6-w1-w2}Al_{w1+w2}N_{11-w1}O_{y+w1}$ contains divalent ions A (A=Ca, Mg, Sr, Ba) in a concentration range of 0≤x+y≤0.3, sometimes using Ca as the divalent ion. For cerium-doped material, Ce is contained as the dopant element M in a concentration range of 0≤z≤0.15. In some embodiments, the first phase material contains a mixture of La and Lu as the rear earth element RE, with a relative concentration of Lu in the range of $$0 \leq \frac{[Lu^{3+}]}{[Lu^{3+}] + [La^{3+}]} \leq 0.3.$$

The inventors observed that the above-described second phase materials, $RESi_3N_5$ and $RE_3ASi_5N_9O_2$, are generated during the synthesis of the first phase material, $RE_3Si_6N_{11}$. In particular, when a first phase material $RE_3Si_6N_{11}$ was synthesized in powder form without second phases, when the powder was sintered into a green body ceramic, one or more second phases appeared after heating to above 1600° C. in sinter runs. The second phase material $RESi_3N_5$ cannot be removed by chemical washing or other chemical treatments because of its chemical stability. The second phase material $RE_3ASi_5N_9O_2$ may be removed under strong acid washing conditions that are harmful to the first phase material, $RE_3Si_6N_{11}$.

The presence of the second phases in the luminescent ceramic may have some benefits.

First, the amount of the second phases can be influenced by the amount of oxygen impurities in the reactive mix of the raw materials and by the relative amounts of the various raw materials, especially by the effective molar La/Si-ratio and the amount of divalent ions A in the mix of precursor materials. The presence of the second phase material $RE_3ASi_5N_9O_2$ may be used to control the amount of oxygen incorporated into the first phase material $RE_3Si_6N_{11}$ which may improve luminescent properties of the luminescent ceramic.

Second, the presence of the second phase material $RE_3ASi_5N_9O_2$ in the luminescent ceramic may enable sintering to a dense polycrystalline composite material at moderate temperature under ambient pressure. This is beneficial for a cost-effective manufacturing process.

Third, the presence of the second phases in the luminescent ceramic may be used to control the scattering properties in the luminescent ceramic, as the second phase materials may have different indices of refraction than the first phase material.

The second phase materials are now described in turn.

In the second phase material $RE_3ASi_5N_9O_2$, the oxygen and nitrogen ions are located on different crystallographic positions with no mutual intermixing. The oxygen ions are located on terminal positions with one-fold coordination to Si-atoms.

In some embodiments, the second phase material $RE_3ASi_5N_9O_2$ may be formed without divalent ions A. From the point of view of charge balance, two explanations are contemplated.

In the first case, the divalent metal ion A is substituted by a further trivalent RE-ion and one terminal divalent oxygen ion is substituted by a trivalent terminal nitrogen atom leading to the second phase formula $RE_4Si_5N_{10}O$. In this case, the second phase material can be formulated in a more general form as $RE_{4-x}A_xSi_{5-w}Al_wN_{10-x-w}O_{1+x+w}$ to include possible extensions of the chemical composition while still crystallizing in the same structure type. RE represents at least one kind of a rare-earth element selected from the group consisting of La, Gd, Lu, Y, Ce and Sc while A represents at least one kind of a metal element selected from the group consisting of Ba, Sr, Ca, Mg, Zn and Eu. The parameters x and w must obey the restrictions $0 \le x \le 4$, $0 \le w \le 5$.

In the second case, the omission of the divalent ion A leads to a cation vacancy which is compensated by the substitution of two trivalent nitrogen ions by two divalent oxygen ions leading to the formula $RE_3Si_5N_7O_4$. In this case, the second phase material $RE_3ASi_5N_9O_2$ can be reformulated in a more general form as $RE_3A_{1-x/2}Si_{5-w}Al_wN_{9-x-w}O_{2+x+w}$. RE represents at least one kind of a rare-earth element selected from the group consisting of La, Gd, Lu, Y, Ce and Sc while A represents at least one kind of a metal element selected from the group consisting of Ba, Sr, Ca, Mg, Zn and Eu. The parameters x and w must obey the restrictions $0 \le x \le 2$, $0 \le w \le 5$.

The second phase material $RE_3ASi_5N_9O_2$ crystallizes in the orthorhombic space group P m n 21, listed as space group 31 in the international tables of crystallography. Its unit cell dimensions are as follows: a=9.483803 Å, b=19.13449 Å, c=12.06382 Å, alpha=90°, beta=90°, and gamma=90°.

The atomic parameters of $RE_3ASi_5N_9O_2$ for the example of $La_3BaSi_5N_9O_2$ are listed in Table 2 below. Atom is the species that occupies a lattice site with a specific Wyckoff position. Ox is the oxidation number of the atom. Site denotes the site symmetry of the respective atom position in the structure. Site "m" indicates that the atom position is located on a mirror plane of the structure. Site "1" indicates that the atom position is not located on any symmetry element of the structure. S.O.F is the site occupation factor. Headings x/a, y/b and z/c refer to the coordinates of the atomic positions in the crystal lattice defined by the lattice constants a, b and c.

TABLE 2

| Atom | Ox. | Wyck. | Site | S.O.F. | x/a | y/b | z/c |
|---|---|---|---|---|---|---|---|
| La1 | 3 | 4b | 1 | 0.9144 | 0.22420(8) | 0.03047(4) | 0.92256(6) |
| Ba1 | 2 | 4b | 1 | 0.0856 | 0.22420(8) | 0.03047(4) | 0.92256(6) |
| La2 | 3 | 4b | 1 | 0.9544 | 0.22608(7) | 0.28788(3) | 0.59655(6) |
| Ba2 | 2 | 4b | 1 | 0.0456 | 0.22608(7) | 0.28788(3) | 0.59655(6) |
| La3 | 3 | 4b | 1 | 0.5433 | 0.2717(2) | 0.21079(9) | 0.09552(13) |
| Ba3 | 2 | 4b | 1 | 0.2067 | 0.2717(2) | 0.21079(9) | 0.09552(13) |
| La4 | 3 | 4b | 1 | 0.1936 | 0.2725(8) | 0.2223(4) | 0.0692(5) |
| Ba4 | 2 | 4b | 1 | 0.0564 | 0.2725(8) | 0.2223(4) | 0.0692(5) |
| La5 | 3 | 4b | 1 | 0.9044 | 0.27890(8) | 0.48297(4) | 0.48236(6) |
| Ba5 | 2 | 4b | 1 | 0.0956 | 0.27890(8) | 0.48297(4) | 0.48236(6) |
| La6 | 3 | 2a | m | 0.3459 | 0 | 0.0542(6) | 0.2231(14) |
| Ba6 | 2 | 2a | m | 0.0841 | 0 | 0.0542(6) | 0.2231(14) |
| La7 | 3 | 2a | m | 0.4585 | 0 | 0.0402(4) | 0.2316(10) |
| Ba7 | 2 | 2a | m | 0.1115 | 0 | 0.0402(4) | 0.2316(10) |
| La8 | 3 | 2a | m | 0.2344 | 0 | 0.09669(6) | 0.63200(9) |
| Ba8 | 2 | 2a | m | 0.7656 | 0 | 0.09669(6) | 0.63200(9) |
| La9 | 3 | 2a | m | 0.8344 | 0 | 0.27154(5) | 0.30800(8) |
| Ba9 | 2 | 2a | m | 0.1656 | 0 | 0.27154(5) | 0.30800(8) |
| La10 | 3 | 2a | m | 0.4544 | 0 | 0.34883(5) | 0.88810(12) |
| Ba10 | 2 | 2a | m | 0.5456 | 0 | 0.34883(5) | 0.88810(12) |
| La11 | 3 | 2a | m | 0.0403 | 0 | 0.6070(7) | 0.7095(16) |
| Ba11 | 2 | 2a | m | 0.0396 | 0 | 0.6070(7) | 0.7095(16) |
| La12 | 3 | 2a | m | 0.1788 | 0 | 0.61423(6) | 0.65333(12) |
| Ba12 | 2 | 2a | m | 0.7412 | 0 | 0.61423(6) | 0.65333(12) |
| La13 | 3 | 2a | m | 0.8244 | 0 | 0.77904(5) | 0.28360(8) |
| Ba13 | 2 | 2a | m | 0.1756 | 0 | 0.77904(5) | 0.28360(8) |

TABLE 2-continued

| Atom | Ox. | Wyck. | Site | S.O.F. | x/a | y/b | z/c |
|---|---|---|---|---|---|---|---|
| La14 | 3 | 2a | m... | 0.9344 | 0 | 0.51509(5) | 0.26193(8) |
| Ba14 | 2 | 2a | m... | 0.0656 | 0 | 0.51509(5) | 0.26193(8) |
| La15 | 3 | 2a | m... | 0.6744 | 0 | 0.85597(5) | 0.91257(8) |
| Ba15 | 2 | 2a | m... | 0.3256 | 0 | 0.85597(5) | 0.91257(8) |
| Si1 | 4 | 4b | 1 | | 0.1636(3) | 0.20837(14) | 0.8093(2) |
| Si2 | 4 | 4b | 1 | | 0.1757(3) | 0.38100(15) | 0.1514(2) |
| Si3 | 4 | 4b | 1 | | 0.1769(3) | 0.64476(14) | 0.3985(3) |
| Si4 | 4 | 4b | 1 | | 0.1808(3) | 0.14229(14) | 0.4051(3) |
| Si5 | 4 | 4b | 1 | | 0.3227(3) | 0.09717(15) | 0.6405(3) |
| Si6 | 4 | 4b | 1 | | 0.3359(3) | 0.29008(15) | 0.3446(3) |
| Si7 | 4 | 4b | 1 | | 0.3368(3) | 0.53404(14) | 0.2322(2) |
| Si8 | 4 | 4b | 1 | | 0.3377(3) | 0.05057(15) | 0.2084(2) |
| Si9 | 4 | 2a | m... | | 0 | 0.1457(2) | 0.0003(4) |
| Si10 | 4 | 2a | m... | | 0 | 0.4030(2) | 0.5446(3) |
| Si11 | 4 | 2a | m... | | 0 | 0.6385(2) | 0.0144(3) |
| Si12 | 4 | 2a | m... | | 0 | 0.8995(2) | 0.5091(4) |
| N1 | −3 | 4b | 1 | | 0.1479(11) | 0.1594(5) | 0.9263(8) |
| N2 | −3 | 4b | 1 | | 0.2275(10) | 0.5678(5) | 0.3317(8) |
| N3 | −3 | 4b | 1 | | 0.2315(14) | 0.3581(7) | 0.0208(12) |
| N4 | −3 | 4b | 1 | | 0.236(1) | 0.3120(5) | 0.2323(9) |
| N5 | −3 | 4b | 1 | | 0.2401(12) | 0.7167(5) | 0.3283(10) |
| N6 | −3 | 4b | 1 | | 0.2425(14) | 0.1089(7) | 0.2844(11) |
| N7 | −3 | 4b | 1 | | 0.2472(11) | 0.2257(5) | 0.4161(9) |
| N8 | −3 | 4b | 1 | | 0.2491(11) | 0.4614(5) | 0.1836(9) |
| N9 | −3 | 4b | 1 | | 0.2552(11) | 0.0912(5) | 0.5071(8) |
| N10 | −3 | 4b | 1 | | 0.2583(11) | 0.1707(5) | 0.7051(9) |
| N11 | −3 | 4b | 1 | | 0.2646(11) | 0.0242(5) | 0.7107(9) |
| N12 | −3 | 4b | 1 | | 0.3496(11) | 0.3583(5) | 0.4388(8) |
| N13 | −3 | 4b | 1 | | 0.352(1) | 0.0843(5) | 0.0779(8) |
| N14 | −3 | 4b | 1 | | 0.3537(10) | 0.5900(5) | 0.1222(8) |
| N15 | −3 | 2a | m... | | 0 | 0.1423(7) | 0.4073(13) |
| N16 | −3 | 2a | m... | | 0 | 0.2321(7) | 0.7564(12) |
| N17 | −3 | 2a | m... | | 0 | 0.3861(7) | 0.1695(13) |
| N18 | −3 | 2a | m... | | 0 | 0.4830(6) | 0.7935(11) |
| N19 | −3 | 2a | m... | | 0 | 0.6470(8) | 0.4111(15) |
| N20 | −3 | 2a | m... | | 0 | 0.7388(6) | 0.7994(11) |
| N21 | −3 | 2a | m... | | 0 | 0.8956(7) | 0.1313(13) |
| N22 | −3 | 2a | m... | | 0 | 0.9648(7) | 0.7753(13) |
| O1 | −2 | 2a | m... | | 0 | 0.0582(6) | 0.0247(10) |
| O2 | −2 | 2a | m... | | 0 | 0.1899(7) | 0.1230(11) |
| O3 | −2 | 2a | m... | | 0 | 0.3211(6) | 0.4971(10) |
| O4 | −2 | 2a | m... | | 0 | 0.4607(7) | 0.4436(12) |
| O5 | −2 | 2a | m... | | 0 | 0.5571(6) | 0.0686(10) |
| O6 | −2 | 2a | m... | | 0 | 0.6995(6) | 0.1159(10) |
| O7 | −2 | 2a | m... | | 0 | 0.8132(7) | 0.4828(12) |
| O8 | −2 | 2a | m... | | 0 | 0.9477(8) | 0.3948(13) |

Figure 12:
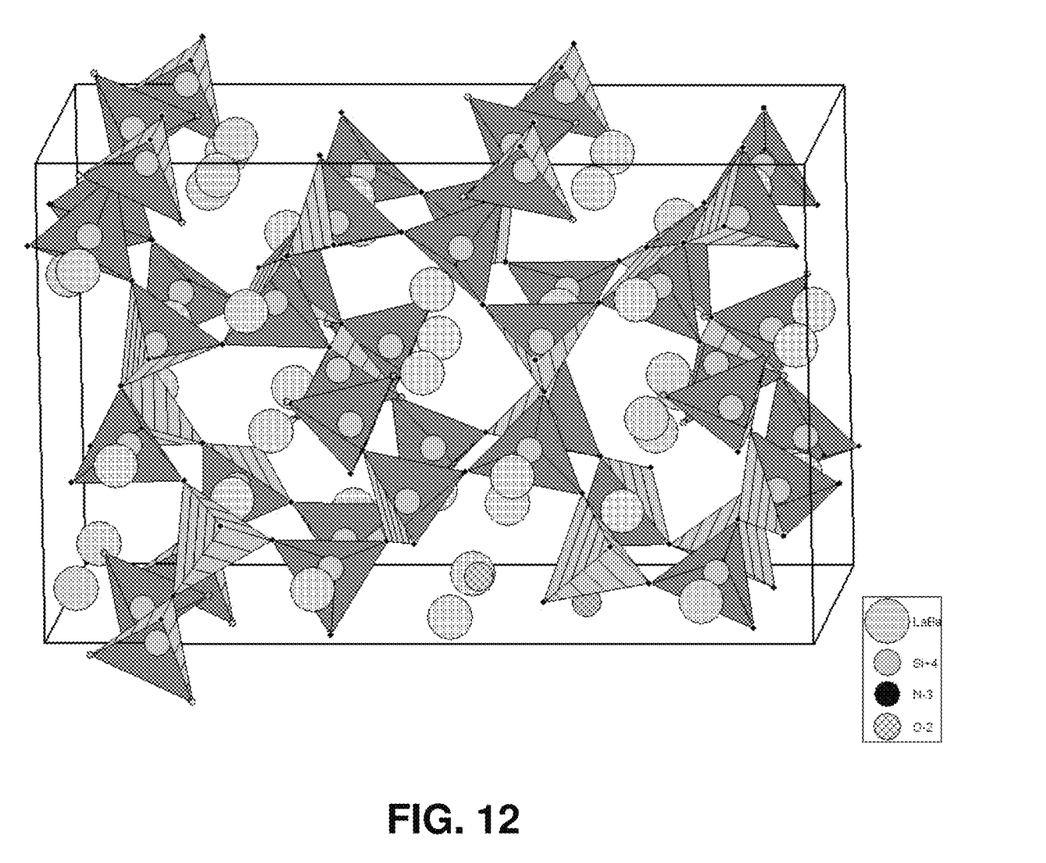
FIG. 12 illustrates the elementary cell of the secondary phase $RE_3ASi_5N_9O_2$ for the example of $La_3BaSi_5N_9O_2$.

FIG. 12 illustrates the elementary cell of $RE_3ASi_5N_9O_2$ for the example of $La_3BaSi_5N_9O_2$.

In a cerium doped luminescent ceramic including the first and second phases, the second phase material $RE_3ASi_5N_9O_2$:Ce absorbs light in the emission range of the first phase material $RE_{3-x-y-z+w2}A_{1.5x+y-w2}M_zSi_{6-w1-w2}Al_{w1+w2}N_{11-w1}O_{y+w1}$ and shows no emission or only weak emission. Thus, this second phase material may be detrimental for the quantum efficiency and conversion efficiency of the luminescent ceramic. Accordingly, in some embodiments, the concentration of the second phase material $RE_3ASi_5N_9O_2$ is minimized as much as possible while still maintaining the sinterability of the luminescent ceramic.

The second phase material $RESi_3N_5$ may be formulated more generally as $RE_{1-x}A_xSi_{3-w}Al_wN_{5-x-w}O_{x+w}$, $0 \le x \le 1$, $0 \le w \le 3$, $0 \le x+w \le 3$, to include possible extensions of its chemical composition while still crystallizing in the same structure type, with RE representing at least one kind of a rare-earth element selected from the group consisting of La, Gd, Lu, Y, Ce and Sc while A represents at least one kind of a metal element selected from the group consisting of Ba, Sr, Ca, Mg, Zn and Eu.

The second phase material $RESi_3N_5$ crystallizes in the orthorhombic space group P21 21 21, listed as space group 19 in the international tables of crystallography. Its unit cell dimensions are a=7.853(1) Å b=11.264(2) Å c=4.8172(1) Å with alpha=90°, beta=90°, and gamma=90°.

The atomic parameters of $RESi_3N_5$ are listed in Table 3 below for the example of $LaSi_3N_5$.

TABLE 3

| Atom | Ox. | Wyck. | Site | S.O.F. | x/a | y/b | z/c |
|---|---|---|---|---|---|---|---|
| La1 | 3 | 4a | 1 | | 0.06038 | 0.16958 | 0.50734 |
| Si1 | 4 | 4a | 1 | | 0.3385 | 0.16052 | 0.0139 |
| Si2 | 4 | 4a | 1 | | 0.2069 | 0.41701 | 0.0163 |
| Si3 | 4 | 4a | 1 | | 0.4671 | 0.04127 | 0.5239 |
| N1 | −3 | 4a | 1 | | 0.1579 | 0.0796 | 0.0463 |
| N2 | −3 | 4a | 1 | | 0.2935 | 0.2949 | 0.1664 |
| N3 | −3 | 4a | 1 | | 0.5188 | 0.0931 | 0.1847 |
| N4 | −3 | 4a | 1 | | 0.1494 | 0.5106 | 0.296 |
| N5 | −3 | 4a | 1 | | 0.3896 | 0.1678 | 0.6705 |

In a cerium doped luminescent ceramic including the first and second phases, the second phase material $LaSi_3N_5$ absorbs light in the UV-range and reemits blue light with a peak emission at 410 nm. When used with a blue light source, the absorption of the Ce-doped $LaSi_3N_5$:Ce may be very low, and therefore may not noticeably impact the quantum efficiency of the luminescent ceramic. If used with a UV light source, blue light emitted by $LaSi_3N_5$:Ce is likely to be absorbed by the cerium doped first phase material $RE_3Si_6N_{11}$ and reemitted as yellow light. Accordingly, the cerium doped second phase material $LaSi_3N_5$ is likely to mainly contribute to scattering and be less detrimental for the quantum efficiency of the luminescent ceramic.

In some embodiments, the first phase comprises at least 88 wt % of the luminescent ceramic, and the second phases comprise no more than 12 wt % of the luminescent ceramic.

In some embodiments, for a cerium doped luminescent ceramic including the first and second phases, the concentration of the second phase material $RE_3ASi_5N_9O_2$:Ce is no more than 2 wt % in some embodiments and no more than 1 wt % in some embodiments. The concentration of the second phase material $RESi_3N_5$:Ce (often $LaSi_3N_5$:Ce) is no more than 10 wt % in some embodiments and no more than 8 wt % in some embodiments. The concentration of the first phase material (often $La_3Si_6N_{11}$:Ce but any of the materials described above) is at least 88 wt % in some embodiments and at least 90 wt % in some embodiments.

In some embodiments, for a europium doped luminescent ceramic including the first and second phases, the concentration of the second phase material $RE_3ASi_5N_9O_2$:Eu is no more than 2 wt % in some embodiments and no more than 1 wt % in some embodiments. The concentration of the second phase material $RESi_3N_5$:Eu (often $LaSi_3N_5$:Eu) is no more than 10 wt % in some embodiments and no more than 8 wt % in some embodiments. The concentration of the first phase material (often $La_3Si_6N_{11}$:Eu but any of the materials described above) is at least 88 wt % in some embodiments and at least 90 wt % in some embodiments.

In some embodiments, one or more third phases may be included in a luminescent ceramic with the first and second phases described above. Small amounts (<5 wt %) of non-crystalline, "glassy" phases that are often formed at grain boundaries of the first and second phases. If, for example, the concentration of smaller RE atoms like Y, Lu or Sc is high, a third phase of composition $RE_{6+(x/3)-(2y/3)-z}A_{y+z}Si_{11-u}Al_uN_{20+x-z-u}O_{1-x+z+u}$ where $0 \le x \le 3$, $0 \le y \le 3$, $0 \le u \le 3$, $0 \le z \le 4$ may form.

In some embodiments, nitride materials such as REN (RE=La,Y,Lu,Gd,Ce,Sc), $Si_3N_4$, AlN, $A_3N_2$ (A=Ca,Sr,Ba,Eu,Mg) are used as precursors to form the luminescent ceramic, as they are commercially available with very low oxygen contents below 1 wt % O. The low oxygen content is beneficial to keep the amount of generated second phase materials as low as possible. The listed nitride raw materials are mixed and fired under nitrogen or forming gas inert atmosphere to obtain a mixture of the first phase material $RE_3Si_6N_{11}$ with at least one second phase material that crystallizes in the $RESi_3N_5$ structure type and/or in the $RE_3ASi_5N_9O_2$ structure type.

In some embodiments, the nitride materials listed above may be replaced completely or at least partly by oxide materials such as $RE_2O_3$ (RE=La,Y,Lu,Gd,Ce,Sc), $SiO_2$, $Al_2O_3$, AO (A=Ca,Sr,Ba,Eu,Mg) in a carbothermal synthesis under nitrogen or forming gas atmosphere where graphite is added to the powder mixture to reduce the oxide components. A mixture of the first phase material $La_3Si_6N_{11}$ with at least one second phase material, $RESi_3N_5$ and/or $RE_4Si_5N_{10}O$, is obtained. This synthesis route is commercially advantageous due to the lower price of the listed oxide materials compared to the listed nitride materials.

In some embodiments, a mixture of the metals RE (RE=La,Y,Lu,Gd,Ce,Sc), Si, Al and A (A=Ca,Sr,Ba,Eu,Mg) can be used as precursors. The metals can be used either as a powder mixture of the individual metals or in form of a prereacted silicide alloy, for example $(RE,Al,A)Si_2$. In this case, the starting material may be nitrided during the firing step under a gas that contains nitrogen. Forming gas or nitrogen can be used as gas atmosphere during the firing step. The nitridation reaction of the metals or silicides can generate a lot of heat. To avoid thermal runaway of the reaction, the nitrogen containing atmosphere can be diluted with another inert gas like argon or He to soften the reaction and limit the heat generation or the nitrogen can be added pulsewise to an inert gas atmosphere like Ar or He to allow the reactive mix to cool down during the time intervals where no nitrogen is present in the gas atmosphere.

In some embodiments, a luminescent ceramic is formed as follows: a mixture of the first phase material $RE_3Si_6N_{11}$:Ce and at least one of the second phase materials $LaSi_3N_5$:Ce and $RE_4Si_5N_{10}O$:Ce is predensified to a green body and sintered to a composite ceramic. The process may be the same for the Eu-doped material system. The predensification to the green body may be done by any suitable method including, for example, pressing or tape casting, while the sintering may be done under normal pressure conditions or under gas pressure conditions, both in an inert gas atmosphere like nitrogen or forming gas. The luminescent ceramic may be fired at temperatures in the 1400-1900° C. range in some embodiments, in the 1550°-1850° C. range in some embodiments, and in the 1650-1750° C. range in some embodiments.

In order to achieve dense ceramics in a sintering process, in some embodiments it is preferred to start from a predensified green body. The densification can be achieved by any suitable ceramic powder processing methods including, for example, uniaxial pressing, isostatic pressing, tape casting, roll compaction, extrusion, electrophoretic deposition, slip casting or injection molding. In some embodiments, ceramic green bodies are made of fine grained particles with grain sizes of at least 0.1 µm in some embodiments, at least 0.5 µm in some embodiments, not more than 3 µm in some embodiments, and not more than 2 µm in some embodiments. Particles of this size often show a higher sinter activity compared to larger particles; higher sinter activity may be needed to achieve full densification during the sintering process. For some green body formation methods, powder with a broad particle size distribution may be used to form high density green bodies.

In some embodiments, it may be difficult to obtain fine particles of the first phase material $RE_3Si_6N_{11}$ as small as 2 µm of diameter or below under ambient pressure firing conditions. In contrast, the second phase material $RE_3ASi_5N_9O_2$ may be easily obtained in the above-recited particle sizes. Accordingly, in some embodiments, a two stage process may be used to manufacture the above-described luminescent ceramics. In the first stage, fine grained $RE_3ASi_5N_9O_2$ powder is synthesized by firing the raw materials at moderate temperatures in the range 1300° C. to 1600° C. in inert atmosphere (nitrogen or forming gas). In the second stage, the second phase material $RE_3ASi_5N_9O_2$ is mixed with fine silicon nitride powder and predensified to a green body via any suitable green body forming method such as, for example, pressing or tape casting. The green body can then be sintered to a dense ceramic in a reactive sintering step under normal pressure conditions or gas pressure conditions in an inert gas atmosphere like nitrogen or forming gas. During the reactive sintering step, the mixture reacts to form a mixture of the first phase material $RE_3Si_6N_{11}$ and the second phase materials $RESi_3N_5$ and $RE_3ASi_5N_9O_2$.

Both second phase material $RE_3ASi_5N_9O_2$ and silicon nitride powder are suitably stable in ambient air conditions. Use of these materials enables the manufacturing of a predensified green body made of fine grained powders through any suitable forming method such as, for example, tape casting or pressing under ambient air conditions without degradation of the material through oxygen pickup.

Figure 10:
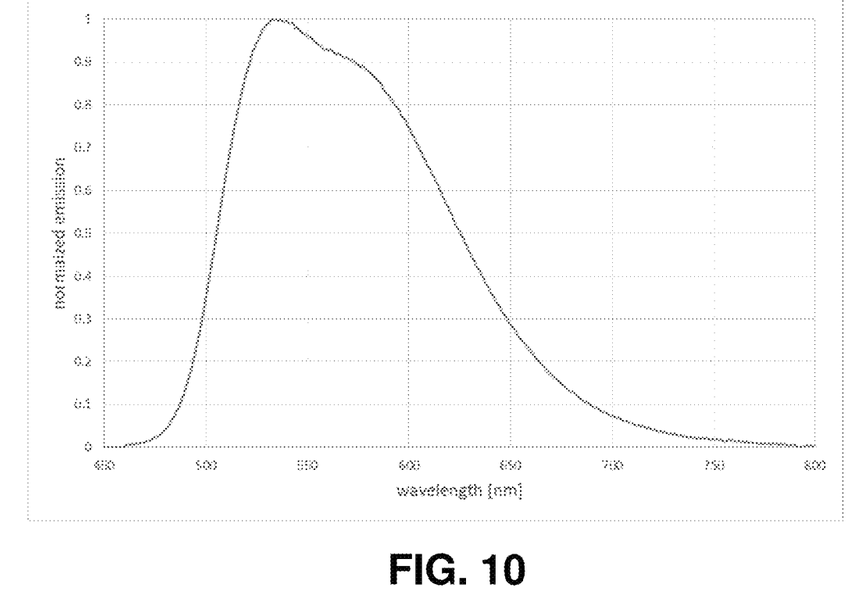
FIG. 10 illustrates the emission spectrum of a luminescent ceramic according to embodiments of the invention.

FIG. 10 illustrates the emission spectrum of a luminescent ceramic according to some embodiments, including a cerium doped first phase material $La_{3-x}Ca_xSi_6N_{11}$:Ce and two second phase materials, cerium doped $La_{1-x}Ca_xSi_3N_{5-x}O$:Ce and cerium doped $La_{4-x}Ca_xN_{10-x}O_x$:Ce.

Figure 11:
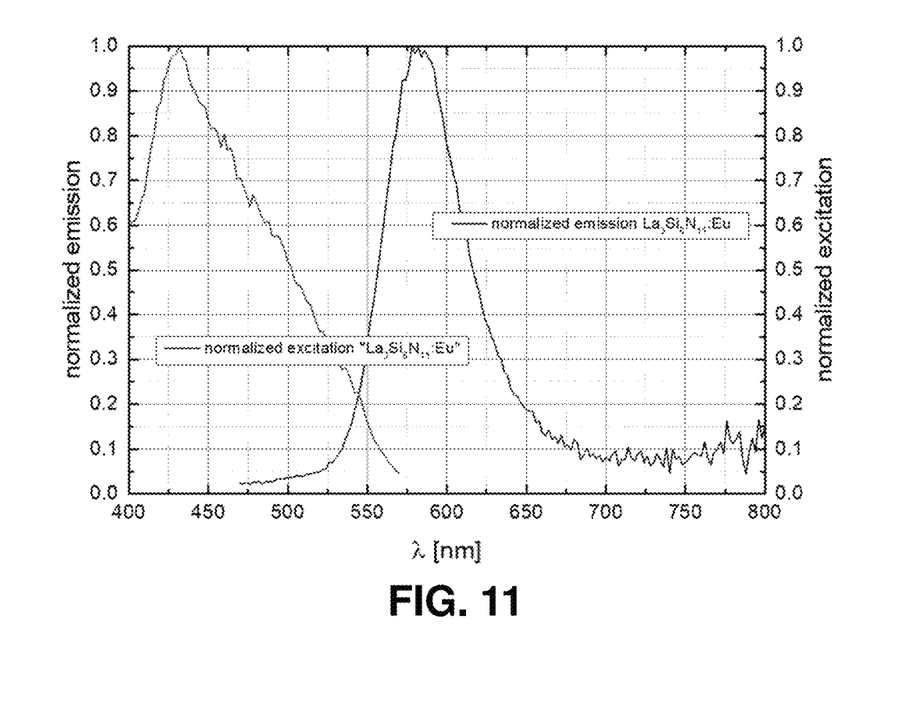
FIG. 11 illustrates the excitation and emission spectra of a luminescent ceramic according to embodiments of the invention.

FIG. 11 illustrates the excitation spectrum (left curve) and emission spectrum (right curve) of a luminescent Eu-doped powder $La_3Si_6N_{11}$:Eu according to some embodiments. The Eu-doped $La_3Si_6N_{11}$:Eu powder shows very narrow band emission centered at 582 nm with a full width at half maximum of 60 nm.

Figure 2:
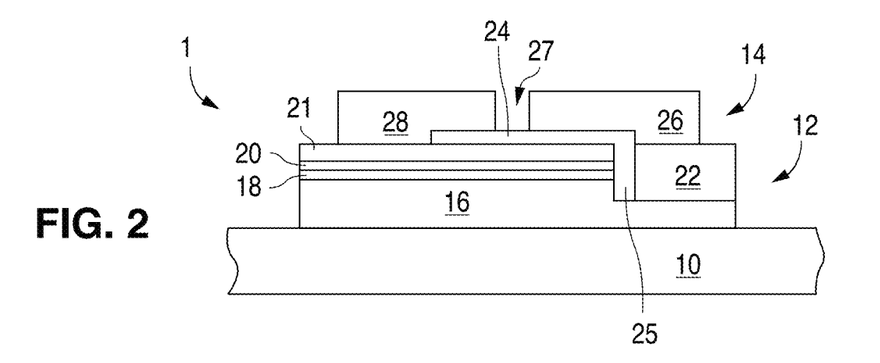
FIG. 2 is a cross sectional view of an LED.

The luminescent ceramic described above may be used, for example, in a light source including a light emitting diode. Light emitted by the light emitting diode is absorbed by the wavelength converting material in the luminescent ceramic according to embodiments of the invention and emitted at a different wavelength. FIG. 2 illustrates one example of a suitable light emitting diode, a III-nitride LED that emits blue light.

Though in the example below the semiconductor light emitting device is a III-nitride LED that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

FIG. 2 illustrates a III-nitride LED 1 that may be used in embodiments of the present invention. Any suitable semiconductor light emitting device may be used and embodiments of the invention are not limited to the device illustrated in FIG. 2. The device of FIG. 2 is formed by growing a III-nitride semiconductor structure 14 on a growth substrate 10 as is known in the art. The growth substrate is often sapphire but may be any suitable substrate such as, for example, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by barrier layers. A p-type region 20 may then be grown over the light emitting region. Like the n-type region, the p-type region may include multiple layers of different composition, thickness, and dopant concentration, including layers that are not intentionally doped, or n-type layers.

After growth, a p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may be filled with a dielectric such as an oxide of silicon or any other suitable material. Multiple n-contact vias may be formed; the n- and p-contacts 22 and 21 are not limited to the arrangement illustrated in FIG. 2. The n- and p-contacts may be redistributed to form bond pads with a dielectric/metal stack, as is known in the art.

In order to form electrical connections to the LED 1, one or more interconnects 26 and 28 are formed on or electrically connected to the n- and p-contacts 22 and 21. Interconnect 26 is electrically connected to n-contact 22 in FIG. 5. Interconnect 28 is electrically connected to p-contact 21. Interconnects 26 and 28 are electrically isolated from the n- and p-contacts 22 and 21 and from each other by dielectric layer 24 and gap 27. Interconnects 26 and 28 may be, for example, solder, stud bumps, gold layers, or any other suitable structure.

The substrate 10 may be thinned or entirely removed. In some embodiments, the surface of substrate 10 exposed by thinning is patterned, textured, or roughened to improve light extraction.

Any suitable light emitting device may be used in light sources according to embodiments of the invention. The invention is not limited to the particular LED illustrated in FIG. 2. The light source, such as, for example, the LED illustrated in FIG. 2, is illustrated in the following figures by block 1.

Figure 3:
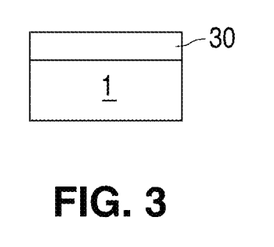
FIG. 3 is a cross sectional view of a device with a wavelength converting structure in direct contact with an LED.
Figure 4:
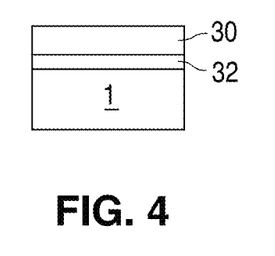
FIG. 4 is a cross sectional view of a device with a wavelength converting structure in close proximity to an LED.
Figure 5:
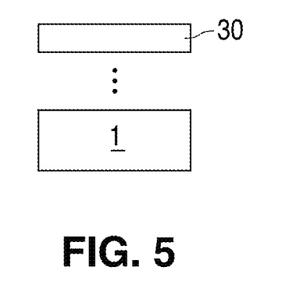
FIG. 5 is a cross sectional view of a device with a wavelength converting structure spaced apart from an LED.
Figure 6:
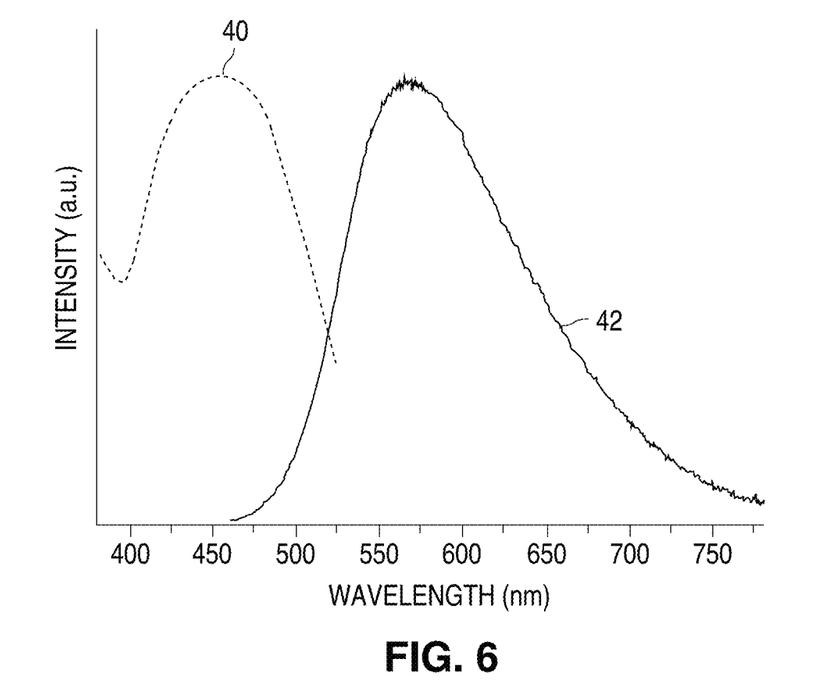
FIGS. 6, 7, 8, and 9 illustrate excitation and emission spectra for materials according to embodiments of the invention.
Figure 7:
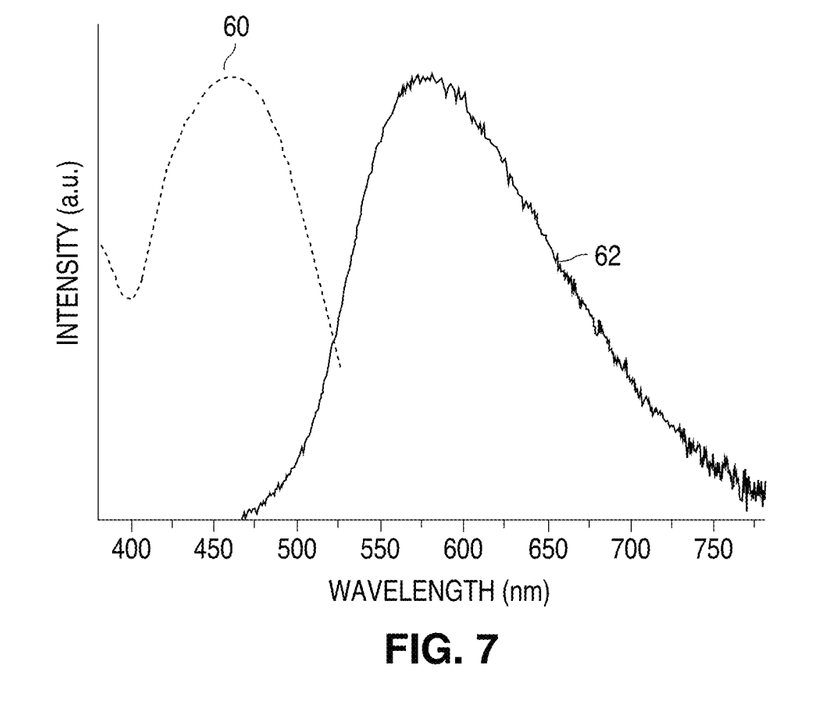
Figure 8:
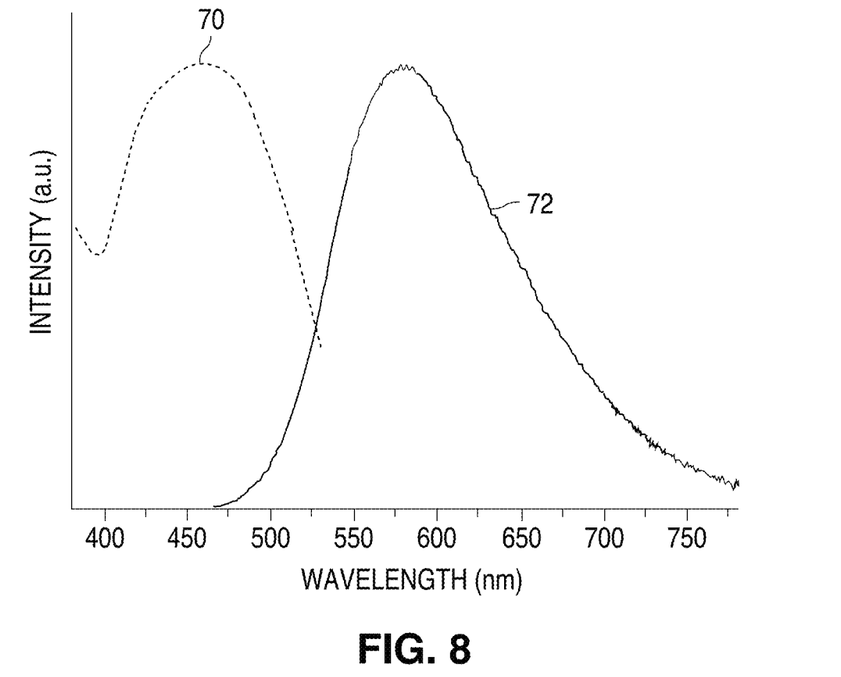
Figure 9:
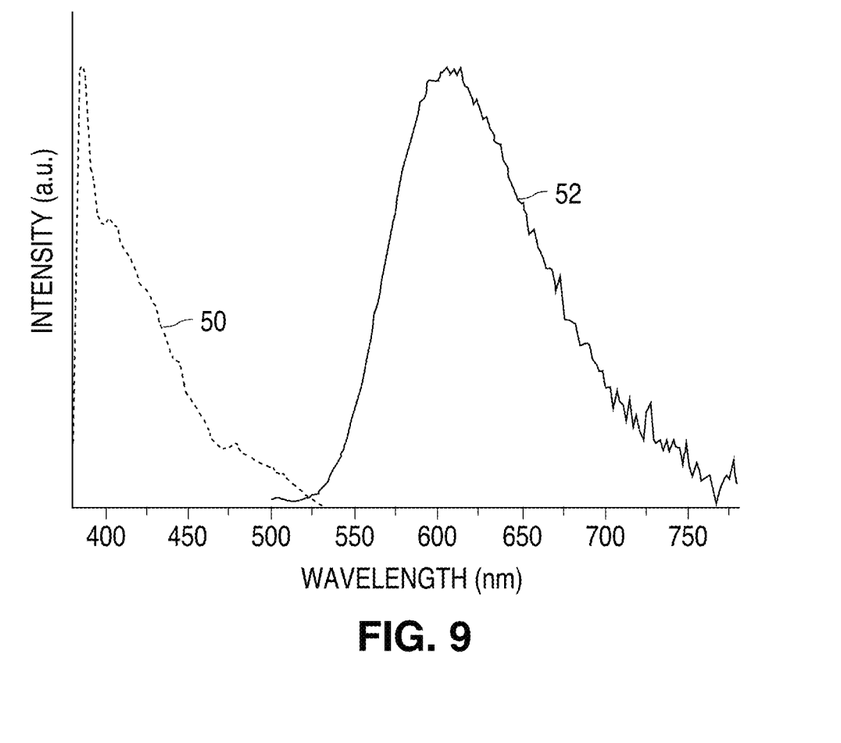

FIGS. 3, 4, and 5 illustrate devices that combine an LED 1 and a wavelength converting structure 30. The wavelength converting structure may include the luminescent ceramic described above.

In FIG. 3, the wavelength converting structure 30 is directly connected to the LED 1. For example, the wavelength converting structure may be directly connected to the substrate 10 illustrated in FIG. 2, or to the semiconductor structure, if the substrate 10 is removed.

In FIG. 4, the wavelength converting structure 30 is disposed in close proximity to LED 1, but not directly connected to the LED 1. For example, the wavelength converting structure 30 may be separated from LED 1 by an adhesive layer 32, a small air gap, or any other suitable structure. The spacing between LED 1 and the wavelength converting structure 30 may be, for example, less than 500 μm in some embodiments.

In FIG. 5, the wavelength converting structure 30 is spaced apart from LED 1. The spacing between LED 1 and the wavelength converting structure 30 may be, for example, on the order of millimeters in some embodiments. Such a device may be referred to as a "remote phosphor" device. Remote phosphor arrangements may be used, for example, in backlights for displays.

The wavelength converting structure 30 may be square, rectangular, polygonal, hexagonal, circular, or any other suitable shape. The wavelength converting structure may be the same size as LED 1, larger than LED 1, or smaller than LED 1.

The wavelength converting structure may include one or more wavelength converting layers in addition to the luminescent ceramic described above.

Examples of suitable additional wavelength converting layers include structures that are formed separately from LED 1, such as other ceramic wavelength converting layers, powder phosphors that are disposed in transparent material such as silicone or glass and rolled, cast, or otherwise formed into a sheet, then singulated into individual wavelength converting structures, and wavelength converting materials such as powder phosphors that are disposed in a transparent material such as silicone that is formed into a flexible sheet, which may be laminated or otherwise disposed over an LED 1.

Examples suitable additional wavelength converting layers also include structures that are formed in situ with LED 1 or with the luminescent ceramics described above, such as powder phosphors that are mixed with a transparent material such as silicone and dispensed, screen printed, stenciled, molded, or otherwise disposed over LED 1 or a luminescent ceramic, and wavelength converting materials that are coated on LED 1 or a luminescent ceramic by electrophoretic, vapor, or any other suitable type of deposition.

The wavelength converting structure 30 may also include, for example, other phosphors, organic phosphors, quantum dots, organic semiconductors, II-VI or III-V semiconductors, II-VI or III-V semiconductor quantum dots or nanocrystals, dyes, polymers, or other materials that luminesce.

The wavelength converting structure absorbs light emitted by the LED and emits light of one or more different wavelengths. Unconverted light emitted by the LED is often part of the final spectrum of light extracted from the structure, though it need not be. Examples of common combinations to create white composite light include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light extracted from the structure.

In some embodiments, other materials may be added to the wavelength converting structure or applied to the LED 1, such as, for example, materials that improve optical performance, materials that encourage scattering, and/or materials that improve thermal performance.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A luminescent ceramic comprising:
   a first phase comprising $RE_{3-x-y-z+w2}A_{1.5x+y-w2}M_z Si_{6-w1-w2}Al_{w1+w2}N_{11-y-w1}O_{y+w1}$ and a dopant, wherein:
   $0 \leq x \leq 2$;
   $0 \leq y \leq 3$;
   $0 \leq z \leq 3$;
   $0 \leq w1 \leq 6$;
   $0 \leq x+y+z-w2 \leq 3$;
   $0 \leq w1+w2 \leq 6$;
   $0 \leq w2 \leq x+y \leq 3$;
   R is selected from the group of trivalent La, Gd, Tb, Y, and Lu, and combinations thereof;
   A is selected from the group of bivalent Ca, Mg, Sr, Ba, and Eu;
   M is selected from the group of trivalent Ce, Pr and Sm; and
   a second phase comprising at least one material selected from the group consisting of $RE_{4-x}A_xSi_{5-w}Al_wN_{10-x-w}O_{1+x+w}$, $0 \leq x \leq 4$, $0 \leq w \leq 5$, $RE_3A_{1-x/2}Si_{5-w}Al_wN_{9-x-w}O_{2+x+w}$, $0 \leq x \leq 2$, $0 \leq w \leq 5$, and $RE_{1-x}A_xSi_{3-w}Al_wN_{5-x-w}O_{x+w}$, $0 \leq x \leq 1$, $0 \leq w \leq 3$, $0 \leq x+w \leq 3$, wherein RE is at least one rare-earth element selected from the group consisting of La, Gd, Lu, Y, Ce and Sc and wherein A is at least one metal element selected from the group consisting of Ba, Sr, Ca, Mg, Zn and Eu.

2. The luminescent ceramic of claim 1 wherein the first phase comprises at least 88 wt % of the luminescent ceramic, and the second phase comprises no more than 12 wt % of the luminescent ceramic.

3. The luminescent ceramic of claim 1 wherein the second phase comprises $RE_3ASi_5N_9O_2$.

4. The luminescent ceramic of claim 1 wherein the second phase comprises $RESi_3N_5$.

5. The luminescent ceramic of claim 1 wherein the first phase has a different index of refraction from the second phase.

6. The luminescent ceramic of claim 1 further comprising a third phase.

7. The luminescent ceramic of claim 6 wherein the third phase is $RE_{6+(x/3)-(2y/3)-z}A_{y+z}Si_{11-u}Al_uN_{20+x-z-u}O_{1-x+z+u}$ where $0 \leq x \leq 3$, $0 \leq y \leq 3$, $0 \leq u \leq 3$, $0 \leq z \leq 4$.

8. The luminescent ceramic of claim 1 wherein the luminescent ceramic emits light having a peak wavelength in the range orange-red.

9. The luminescent ceramic of claim 1 wherein the luminescent ceramic emits light having a peak wavelength in the range green-yellow.

10. The luminescent ceramic of claim 1 wherein the second phase is $La_{3-x}Ca_{1.5x}Si_6N_{11}:Eu^{2+}$.

11. A light source comprising:
    a light emitting diode that emits blue light; and
    a wavelength converting structure comprising a luminescent ceramic disposed in a path of the blue light, the luminescent ceramic comprising:
    a first phase comprising $R_{3-x-y-z+w2}A_{1.5x+y-w2}M_z Si_{6-w1-w2}Al_{w1-w2}N_{11-y-w1}O_{y+w1}$ and a dopant, wherein:
    $0 \leq x \leq 2$;
    $0 \leq y \leq 3$;
    $0 \leq z \leq 3$;
    $0 \leq w1 \leq 6$;
    $0 \leq x+y+z-w2 \leq 3$;
    $0 \leq w1+w2 \leq 6$;
    $0 \leq w2 \leq x+y \leq 3$;
    R is selected from the group of trivalent La, Gd, Tb, Y, and Lu, and combinations thereof;
    A is selected from the group of bivalent Ca, Mg, Sr, Ba, and Eu;
    M is selected from the group of trivalent Ce, Pr and Sm; and
    a second phase comprising at least one material selected from the group consisting of $RE_{4-x}A_xSi_{5-w}Al_wN_{10-x-w}O_{1+x+w}$, $0 \leq x \leq 4$, $0 \leq w \leq 5$, $RE_3A_{1-x/2}Si_{5-w}Al_wN_{9-x-w}O_{2+x+w}$, $0 \leq x \leq 2$, $0 \leq w \leq 5$, and $RE_{1-x}A_xSi_{3-w}Al_w$ $N_{5-x-w}O_{x+w}$, $0 \leq x \leq 1$, $0 \leq w \leq 3$, $0 \leq x+w \leq 3$, wherein RE is at least one rare-earth element selected from the group consisting of La, Gd, Lu, Y, Ce and Sc and wherein A is at least one metal element selected from the group consisting of Ba, Sr, Ca, Mg, Zn and Eu.

12. The light source of claim 11 wherein the luminescent ceramic emits light having a peak wavelength that is yellow or green, the wavelength converting structure further comprising a wavelength converting material that emits light having a peak wavelength that is red.

13. The light source of claim 11 wherein the first phase comprises at least 88 wt % of the luminescent ceramic, and the second phase comprises no more than 12 wt % of the luminescent ceramic.

14. The light source of claim 11 wherein the second phase comprises $RE_3ASi_5N_9O_2$.

15. The light source of claim 11 wherein the second phase comprises $RESi_3N_5$.

16. The light source of claim 11 further comprising a third phase.

17. The light source of claim 16 wherein the third phase is $RE_{6+(x/3)-(2y/3)-z}A_{y+z}Si_{11-u}Al_uN_{20+x-z-u}O_{1+x-z-u}$ where $0 \leq x \leq 3$, $0 \leq y \leq 3$, $0 \leq u \leq 3$, $0 \leq z \leq 4$.

18. The light source of claim 11 wherein the second phase is $La_{3-x}Ca_{1.5x}Si_6N_{11}:Eu^{2+}$.

19. The luminescent ceramic of claim 1, wherein the dopant is selected from one of $Ce^{2+}$, $Eu^{2+}$, or a combination of $Ce^{2+}$ and $Eu^{2+}$.

20. The luminescent ceramic of claim 1, wherein the dopant comprises $Eu^{2+}$, M=0, and A includes at least one of Ca, Mg, Sr, Ba.

* * * * *

UNITED STATES PATENT AND TRADEMARK OFFICE
CERTIFICATE OF CORRECTION

PATENT NO. : 11,208,593 B2  
APPLICATION NO. : 16/373043  
DATED : December 28, 2021  
INVENTOR(S) : Martiny et al.

Page 1 of 1

It is certified that error appears in the above-identified patent and that said Letters Patent is hereby corrected as shown below:

On the Title Page

Item (71) Applicant: Line 1 should read: -- Lumileds Holding B.V. --

In the Claims

Column 15, Line 61 should read: -- $R_{3-x-y-z+w2}A_{1.5x+y-w2}M_z$ --

Column 15, Line 62 should read: -- $Al_{w1-w2}$ --

Signed and Sealed this  
Tenth Day of May, 2022

Katherine Kelly Vidal  
*Director of the United States Patent and Trademark Office*